(12) United States Patent
Jeong

(10) Patent No.: US 7,715,249 B2
(45) Date of Patent: May 11, 2010

(54) SEMICONDUCTOR MEMORY HAVING AN OUTPUT DRIVER EQUIPPED WITH A THRESHOLD VOLTAGE DETECTING CIRCUIT FOR ADAPTING THE DRIVE CAPABILITY THEREOF

(75) Inventor: Byung-Deuk Jeong, Ichon (KR)

(73) Assignee: Hynix Semiconductor Inc. (KR)

( * ) Notice: Subject to any disclaimer, the term of this patent is extended or adjusted under 35 U.S.C. 154(b) by 125 days.

(21) Appl. No.: 12/169,517

(22) Filed: Jul. 8, 2008

(65) Prior Publication Data
US 2009/0147593 A1     Jun. 11, 2009

(30) Foreign Application Priority Data
Dec. 10, 2007  (KR) .................... 10-2007-0127592

(51) Int. Cl.
*G11C 7/10*     (2006.01)
*H03K 19/0185*  (2006.01)
(52) U.S. Cl. ............... 365/189.15; 365/189.05; 365/189.09; 365/189.07; 365/189.08; 326/83; 326/87; 326/32; 326/31
(58) Field of Classification Search ............ 365/189.09, 365/189.07, 189.08, 189.15, 189.05; 326/85, 326/83, 86, 87, 32, 33, 31, 30
See application file for complete search history.

(56) References Cited

U.S. PATENT DOCUMENTS

| | | | | |
|---|---|---|---|---|
| 5,457,407 A | * | 10/1995 | Shu et al. ................. | 326/30 |
| 5,559,447 A | * | 9/1996 | Rees ....................... | 326/30 |
| 6,087,853 A | * | 7/2000 | Huber et al. ............... | 326/83 |
| 6,654,310 B2 | | 11/2003 | Nam | |
| 6,842,815 B2 | | 1/2005 | Yim et al. | |
| 7,136,310 B2 | | 11/2006 | Kasamsetty | |
| 2009/0147593 A1 | * | 6/2009 | Jeon ........................ | 365/189.07 |

FOREIGN PATENT DOCUMENTS

| | | |
|---|---|---|
| KR | 1019980006880 | 3/1998 |
| KR | 1019980058174 | 9/1998 |

\* cited by examiner

*Primary Examiner*—Andrew Q Tran
(74) *Attorney, Agent, or Firm*—Baker & McKenzie LLP

(57) ABSTRACT

An output driver of a semiconductor memory apparatus comprises a voltage dividing block configured to generate divide voltages by dividing an internal voltage, a threshold voltage detecting block configured to generate a detecting voltage corresponding to a change in a threshold voltage of a transistor, a drive capability control signal generating block 300 configured to generate a compare signal by comparing the levels of the detecting voltage with the divide voltage and generate a control signal in response to an input signal when the compare signal is enabled, and a drive capability controlling block comprising a driver configured to perform a driving operation in response to the input signal, and a control driver configured to perform a driving operation in response to the control signal.

15 Claims, 5 Drawing Sheets

SEMICONDUCTOR MEMORY HAVING AN OUTPUT DRIVER EQUIPPED WITH A THRESHOLD VOLTAGE DETECTING CIRCUIT FOR ADAPTING THE DRIVE CAPABILITY THEREOF

CROSS-REFERENCES TO RELATED APPLICATION

The present application claims priority under 35 U.S.C. 119(a) to Korean application number 10-2007-0127592, filed in the Korean Intellectual Property Office on Dec. 10, 2007, which is incorporated by reference in its entirety as if set forth in full.

BACKGROUND

1. Technical Field

The embodiments herein relate to a semiconductor memory apparatus, and more particularly, an output driver configured to output a data signal from a semiconductor memory apparatus.

2. Related Art

An output driver of a conventional semiconductor memory apparatus outputs data and transmits the data to another external chip. A conventional output driver is generally composed of a pull-up driver and a pull-down driver. A conventional pull-up driver includes a plurality of PMOS transistors that each receives a pull-up signal to adjust current driving capability, i.e. pull-up capability of an output terminal. The pull-up signal is then transmitted to the PMOS transistors through metal options. Therefore, the pull-up capability of the pull-up driver is adjusted by turning on/off the metal options.

A conventional pull-down driver includes a plurality of NMOS transistors that each receives a pull-down signal to adjust current driving capability, i.e. pull-down capability of the output terminal. The pull-down signal is transmitted to the NMOS transistors through a metal option. Therefore, the pull-down capability of the pull-down driver is adjusted by turning on/off the metal options.

A conventional output driver fixes the pull-up capability and the pull-down capability by determining whether to turn on/off the metal options in a wafer state. When the semiconductor memory apparatus is tested after being packaged, the pull-up and pull-down capability of the output driver that is fixed in the wafer state may be changed due to changes in P. V. T (process, voltage, temperature). However, as the pull-up and pull-down capability of the output driver is changed after being packaged, the design of the semiconductor memory apparatus should be changed through revision, which requires a large amount of time and money.

SUMMARY

An output driver of a semiconductor memory apparatus that maintains pull-up and pull-down capabilities, regardless of changes in P. V. T., is described herein.

According to one aspect, an output driver of a semiconductor memory apparatus can include a voltage dividing block configured to generate divide voltages by dividing an internal voltage, a threshold voltage detecting block configured to generate a detecting voltage corresponding to changes in a threshold voltage of a transistor, a drive capability control signal generating block configured to generate a compare signal by comparing the levels of the detecting voltage with the divide voltage and generate a control signal in response to an input signal when the compare signal is enabled, and a drive capability controlling block that has a driver that can perform a driving operation in response to the input signal and a control driver that can perform a driving operation in response to the control signal.

According to another aspect an output driver of a semiconductor memory apparatus can include a voltage dividing block that is configured to generate a first divide voltage and a second divide voltage by dividing an internal voltage, a threshold voltage generating block that is configured to generate a first detecting voltage which can be inversely proportional to a change in level of a threshold voltage of a first transistor and to generate a second detecting voltage which can be proportional to a level of a threshold voltage of a second transistor; a drive capability control signal generating block that is configured to generate a first control signal in response to a pull-up signal when a first compare signal is enabled, the first compare signal can be generated by comparing levels of the first divide voltage and the first detecting voltage, and to generate a second control signal in response to a pull-down signal when a second compare signal is enabled, the second compare signal can be generated by comparing levels of a second divide voltage and the second detecting voltage, and a drive capability controlling block that can includes a pull-up driver having a first driver that can perform a driving operation in response to the pull-up signal and a first control driver that can perform a driving operation in response to a first control signal, and a pull-down driver having a second driver that can perform a driving operation in response to the pull-down signal and a second control driver that can perform a driving operation in response to the second control signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
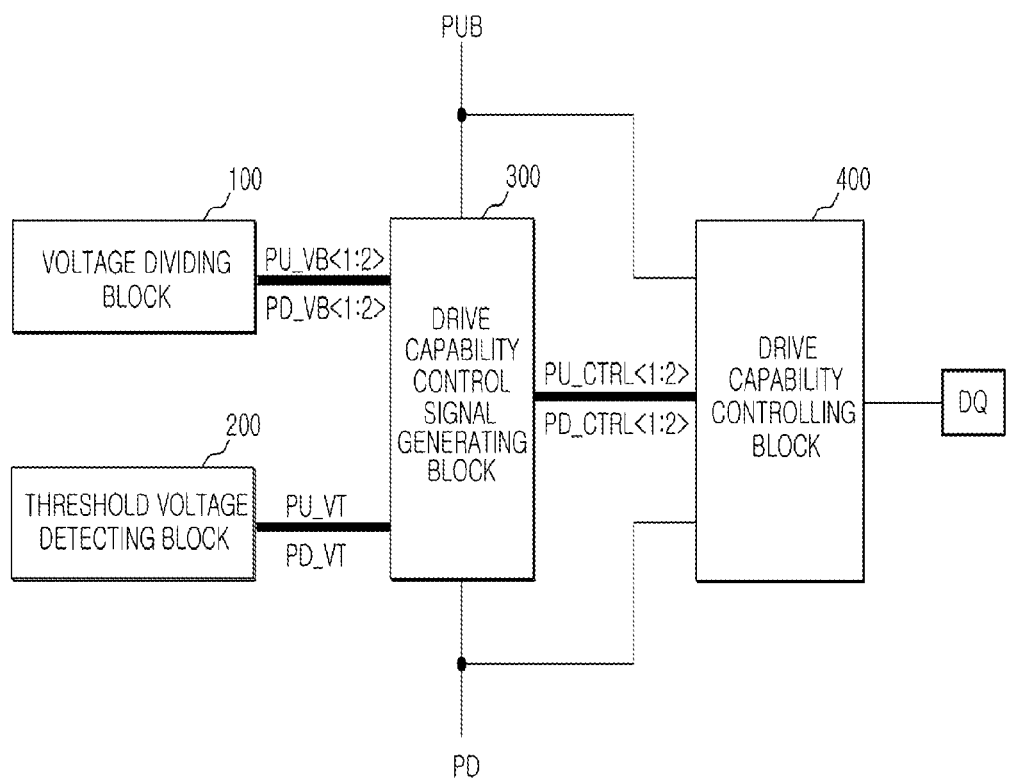
FIG. 1 is a diagram illustrating the configuration of an output driver of a semiconductor memory apparatus according to an embodiment described herein.

FIG. 1 is a diagram illustrating the configuration of an output driver of a semiconductor memory apparatus according to an embodiment described herein. Referring to FIG. 1, the output driver can include a voltage dividing block 100, a threshold voltage detecting block 200, a drive capability control signal generating block 300, and a drive capability controlling block 400.

The voltage dividing block 100 can be configured to generate first to fourth divide voltages 'PU_VB<1:2>', 'PD_VB<1:2>' by dividing an internal voltage 'VINT'.

Figure 2:
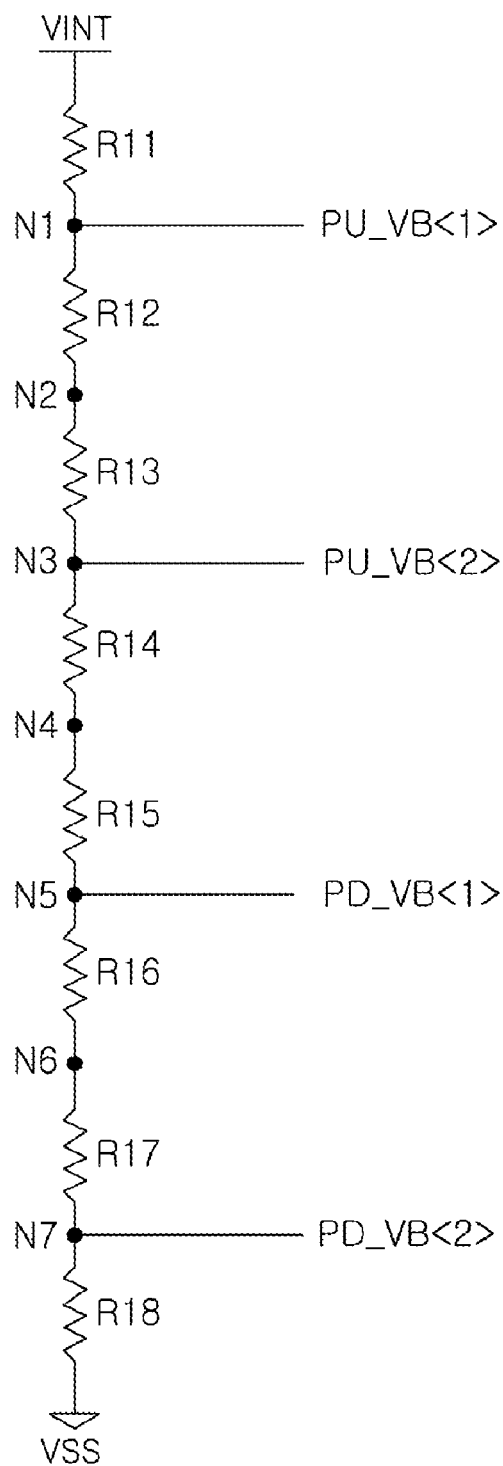
FIG. 2 is a diagram illustrating the detailed configuration of the voltage dividing block that can be included in the circuit of FIG. 1.

FIG. 2 is a diagram illustrating the detailed configuration of the voltage dividing block 100 that can be included in the circuit of FIG. 1. The voltage dividing block 100, as shown in FIG. 2, can include first to eighth resistor elements R11 to R18. The first to eighth resistor elements R11 to R18 can be connected in series. The internal voltage 'VINT' can be applied to one end of the first resistor elements R11 and a grounding terminal VSS can be connected to one end of the eighth resistor element R18. A first node N1 can connect the first resistor element R11 with the second resistor element R12. A second node N2 can connect the second resistor element R12 with the third resistor element R13. A third node N3 can connect the third resistor element R13 with the fourth resistor element R14. A fourth Node N4 can connect the fourth resistor element R14 with the fifth resistor element R15. A fifth Node N5 can connect the fifth resistor element R15 with the sixth resistor element R16. A sixth node N6 can connect the sixth resistor element R16 with the seventh resistor element R17. A seventh node N7 can connect the seventh resistor element R17 with the eighth resistor element R18. Further, the first node N1, can output the first divide voltage 'PU_VB<1>'. The third node N3 can output the second divide voltage 'PU_VB<2>'. The fifth node N5 can output the third divide voltage 'PD_VB<1>'. The seventh node N7 can output the fourth divide voltage 'PD_VB<2>'.

Figure 3:
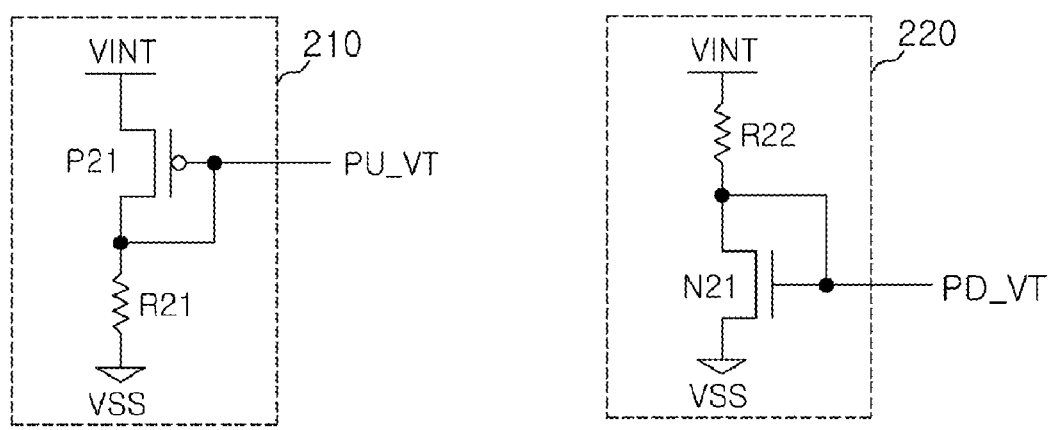
FIG. 3 is a diagram illustrating the detailed configuration of the threshold voltage detecting block that can be included in the circuit of FIG. 1.

FIG. 3 is a diagram illustrating the detailed configuration of the threshold voltage detecting block 200 that can be included in the circuit of FIG. 1. The threshold voltage detecting block 200, as shown in FIG. 3, can include a pull-up threshold voltage detecting unit 210 and a pull-down threshold voltage detecting unit 220.

The pull-up threshold voltage detecting unit 210 can include a first transistor P21 and a ninth resistor element R21. The internal voltage 'VINT' can be applied to the first transistor P21 through a source. An end of the ninth resistor element R21 can be connected with a gate and a drain of the first transistor P21 and the other end of the ninth resistor can be connected with the grounding terminal VSS. The node connecting the first transistor P21 with the ninth resistor element R21 can output a pull-up detecting voltage 'PU_VT', which can be applied when turned on, to its threshold voltage and output the dropped voltage. Therefore, the first transistor P21 turned on can drop the level of the internal voltage 'VINT' and can output the voltage as the pull-up detecting voltage 'PU_VT'. The level of the pull-up detecting voltage 'PU_VT' can be expressed as 'VINT'-'Vth' (the threshold voltage of the first transistor P21). That is, the pull-up voltage detecting unit 210 can detect changes of the threshold voltage of the first transistor P21 due to changes in P. V. T (process, voltage, temperature) and can output the detected result as the pull-up detecting voltage 'PU_VT'. For example, as the threshold voltage of the first transistor P21 increases, the level of the pull-up detecting voltage 'PU_VT' can decrease, whereas when the threshold voltage of the first transistor P21 decreases, the level of the pull-up detecting voltage 'PU_VT' can increase.

The pull-down threshold voltage detecting unit 220 can include a second transistor N21 and a tenth resistor element R22. The internal voltage 'VINT' can be applied to an end of the tenth resistor element R22. A drain and a gate of the second transistor N21 can be connected with the other end of the tenth resistor element R22 and a source of the second transistor N21 can be connected with the grounding terminal VSS. The node connecting the tenth resistor element R22 with the second transistor N21 can output a pull-down detecting voltage 'PD_VT'. That is, the level of the pull-down detecting voltage 'PD_VT' can be the same as the voltage difference between the source and the drain of the second transistor N21. Further, in general, a transistor can drop a voltage, which can be applied when turned on, to its threshold voltage and can output the dropped voltage. Therefore, the level of the pull-down detecting voltage 'PD_VT' can be the same as the threshold voltage of the second transistor N21.

Figure 4:
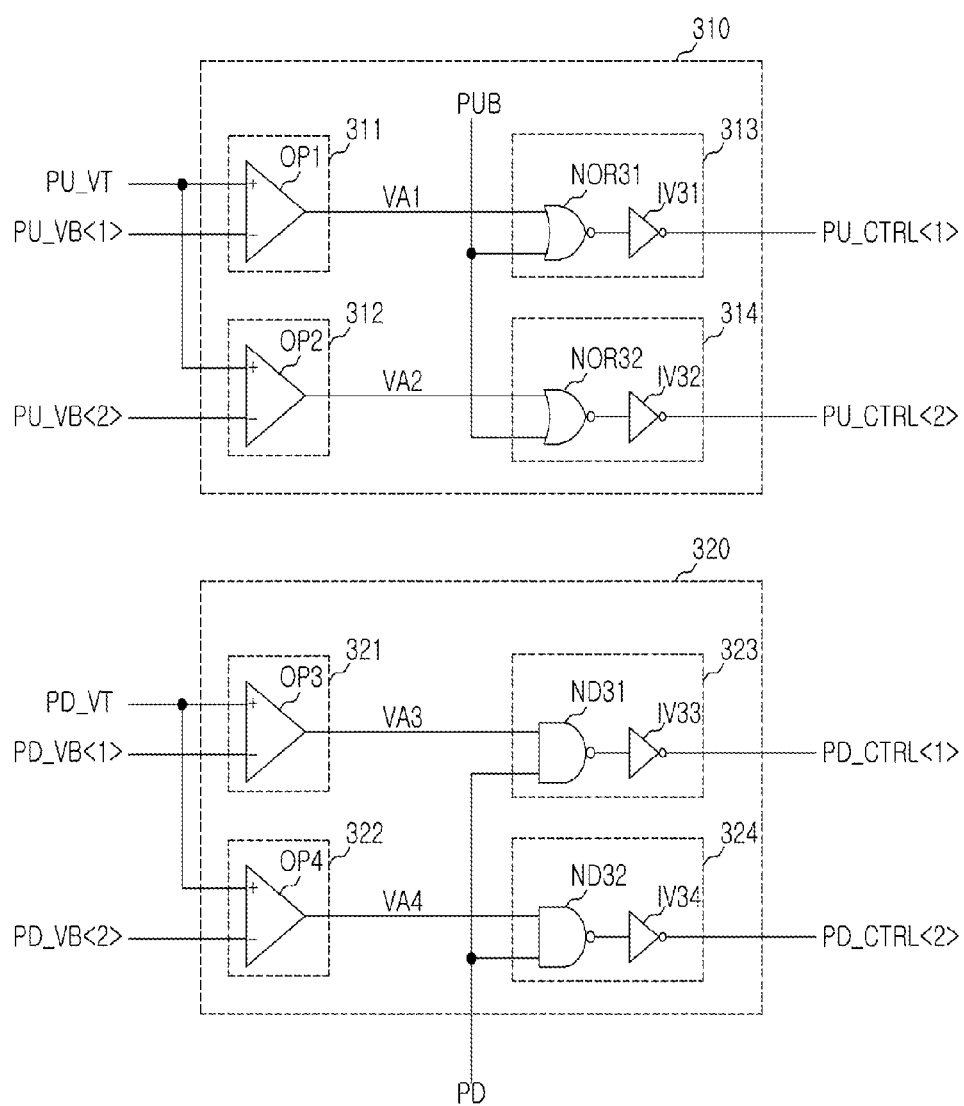
FIG. 4 is a diagram illustrating the detailed configuration of the drive capability control signal generating block that can be included in the circuit of FIG. 1.

FIG. 4 is a diagram illustrating the detailed configuration of the drive capability control signal generating block 300 that can be included in the circuit of FIG. 1. The drive capability control signal generating block 300, as shown in FIG. 4, can include a pull-up control signal generating unit 310 and a pull-down control signal generating unit 320.

The pull-up control signal generating unit 310 can be configured to generate first and second compare signals 'VA1', 'VA2' by comparing each level of the first and second divide voltages 'PU_VB<1:2>' with the level of the pull-up detecting voltage 'PU_VT'. Further, the pull-up control signal generating unit 310 can generate first and second pull-up control signals 'PU_CTRL<1:2>' in response to the first and second compare signals 'VA1', 'VA2' and a pull-up signal 'PUB'. For example, the pull-up control signal generating unit 310 can generate the first compare signal 'VA1' disabled at a high level, when the pull-up detecting voltage 'PU_VT' is higher than the level of the first divide voltage 'PU_VB<1>'. Further, the pull-up control signal generating unit 310 can disable the first pull-up control signal 'PU_CTRL<1>' to a high level regardless of the pull-up signal 'PUB', when the first compare signal 'VA1' is disabled to a high level. On the other hand, the pull-up control signal generating unit 310 can generate the first compare signal 'VA1' enabled to a low level, when the pull-up detecting voltage 'PU_VT' is lower than the level of the first divide voltage 'PU_VB<1>'. Further, the pull-up control signal generating unit 310 can enable/disable the first pull-up control signal 'PU_VB<1>' to low/high levels, respectively, in response to the pull-up signal 'PUB', when the first compare signal 'VA1' is enabled to a low level. The operation of generating the second compare signal 'VA2' by comparing the pull-up detecting voltage 'PU_VT' with the second divide voltage 'PU_VB<2>' in the pull-up control signal generating unit 310 can be the same as the operation of generating the first compare signal 'VA1'. Further, the operation of generating the second pull-up control signal 'PU_VB<2>' in response to the second compare signal 'VA2' and the pull-up signal PUB in the pull-up control signal generating unit 310 can be the same as the operation of generating the first pull-up control signal 'PU_VB<1>'.

The pull-up control signal generating unit 310 can include first and second comparing units 311, 312 and first and second signal combining units 313, 314. The first comparing unit 311 can generate the first compare signal 'VA1' by comparing the levels of the first divide voltage 'PU_VB<1>' and the pull-up detecting voltages 'PU_VT'.

The first comparing unit 311 can include a first comparer OP1 that can receive the first divide voltage 'PU_VB<1>' and the pull-up detecting voltage 'PU_VT' and can output the first compare signal 'VA1'.

The second comparing unit 312 can generate the second compare signal 'VA2' by comparing the levels of the second divide voltage 'PU_VB<2>' and the pull-up detecting voltage 'PU_VT'. The second comparing unit 312 can include a second comparer OP2 that can compare the levels of the second divide voltage 'PU_VB<2>' and the pull-up detecting voltage 'PU_VT' and can output the second compare signal 'VA2'.

The first signal combining unit 313 can generate the first pull-up control signal 'PU_CTRL<1>' that is enabled to a low level when both of the first compare signal 'VA1' and the pull-up signal PUB are enabled to a low level. The first signal combining unit 313 can include a first NOR gate NOR31 and a first inverter IV31. The first NOR gate NOR31 can receive the first compare signal 'VA1' and the pull-up signal 'PUB'. The first inverter IV31 can receive an output signal of the first NOR gate NOR31 and output the signal as the first pull-up control signal 'PU_CTRL<1>'.

The second signal combining unit 314 can generate the second pull-up control signal 'PU_CTRL<2>' that is enabled to a low level when both of the second compare signal 'VA2' and the pull-up signal 'PUB' are enabled to a low level. The second signal combining unit 314 can includes a second NOR gate NOR32 and a second inverter IV32. The second NOR gate NOR32 can receive the second compare signal 'VA2' and the pull-up signal 'PUB'. The second inverter IV32 can receive an output signal of the second NOR gate NOR32 and can output the signal as the second pull-up control signal 'PU_CTRL<2>'.

The pull-down control signal generating unit 320 can generate third and fourth compare signals 'VA3', 'VA4' by comparing each level of the third and fourth divide voltages 'PD_VB<1:2>' with the level of the pull-down detecting voltage 'PD_VT'. Further, the pull-down control signal generating unit 320 can generate first and second pull-down control signals 'PD_CTRL<1:2>' in response to the third and fourth compare signals 'VA3', 'VA4' and the pull-down signal 'PD'. For example, the pull-down control signal generating unit 320 can generate the third compare signal 'VA3', which can be disabled to a low level, when the pull-down detecting voltage 'PD_VT' is lower than the level of the third divide voltage 'PD_VB<1>'. Further, the pull-down control signal generating unit 320 can disable the first pull-down control signal 'PD_CTRL<1>' to a low level, regardless of the pull-down signal 'PD', when the third compare signal 'VA3' is disabled to a low level. On the other hand, the pull-down control signal generating unit 320 can generate the third compare signal 'VA3' that can be enabled to a high level when the pull-down detecting voltage 'PD_VT' is higher than the level of the third divide voltage 'PD_VB<1>'. Further, the pull-down control signal generating unit 320 can enable/disable the first pull-down control signal 'PD_VB<1>' to high/low levels, respectively, in response to the pull-down signal 'PD', when the third compare signal 'VA3' is enabled to a high level. The operation of generating the fourth compare signal 'VA4' by comparing the pull-down detecting voltage 'PD_VT' with the fourth divide voltage 'PD_VB<2>' in the pull-down control signal generating unit 320 can be the same as the operation of generating the third compare signal 'VA3'. Further, the operation of generating the second pull-down control signal 'PD_VB<2>' in response to the fourth compare signal 'VA4' and the pull-down signal 'PD' in the pull-down control signal generating unit 320 can be the same as the operation of generating the first pull-down control signal 'PD_VB<1>'.

The pull-down control signal generating unit 320 can include third and fourth comparing units 321, 322 and third and fourth signal combining units 323, 324. The third comparing unit 321 can generates the third compare signal VA3 by comparing the level of the third divide voltage 'PD_VB<1>' with the level of the pull-down detecting voltage 'PD_VT'. The third comparing unit 321 can include a third comparer OP3 that can receive the third divide voltage 'PD_VB<1>' and the pull-down detecting voltage 'PD_VT' and output the third compare signal 'VA3'.

The fourth comparing unit 322 can generate the fourth compare signal 'VA4' by comparing the levels of the fourth divide voltage 'PD_VB<2>' and the pull-down detecting voltage 'PD_VT'. The fourth comparing unit 322 includes a fourth compare OP4 that can compare the levels of the fourth divide voltage 'PD_VB<2>' and the pull-down detecting voltage 'PD_VT' and can output the fourth compare signal 'VA4'.

The third signal combining unit 323 can generate the first pull-down control signal 'PD_CTRL<1>' that can be enabled to a high level when both of the third compare signal 'VA3' and the pull-down signal 'PD' are enabled to a high level. The third signal combining unit 323 can include a first NAND gate ND31 and a third inverter IV33. The first NAND gate ND31 can receive the third compare signal 'VA3' and the pull-down signal 'PD'. The third inverter IV33 can receive an output signal of the first NAND gate ND31 and can output the signal as the first pull-down control signal 'PD_CTRL<1>'.

The fourth signal combining unit 324 can generate the second pull-down control signal 'PD_CTRL<2>' that is enabled to a high level when both of the fourth compare signal 'VA4' and the pull-down signal 'PD' are enabled to a high level. The fourth signal combining unit 324 can include a second NAND gate ND32 and a fourth inverter IV34. The second NAND gate ND32 can receive the fourth compare signal 'VA4' and the pull-down signal 'PD'. The fourth inverter IV34 can receive an output signal of the second NAND gate ND32 and can output the signal as the second pull-down control signal 'PD_CTRL<2>'.

Figure 5:
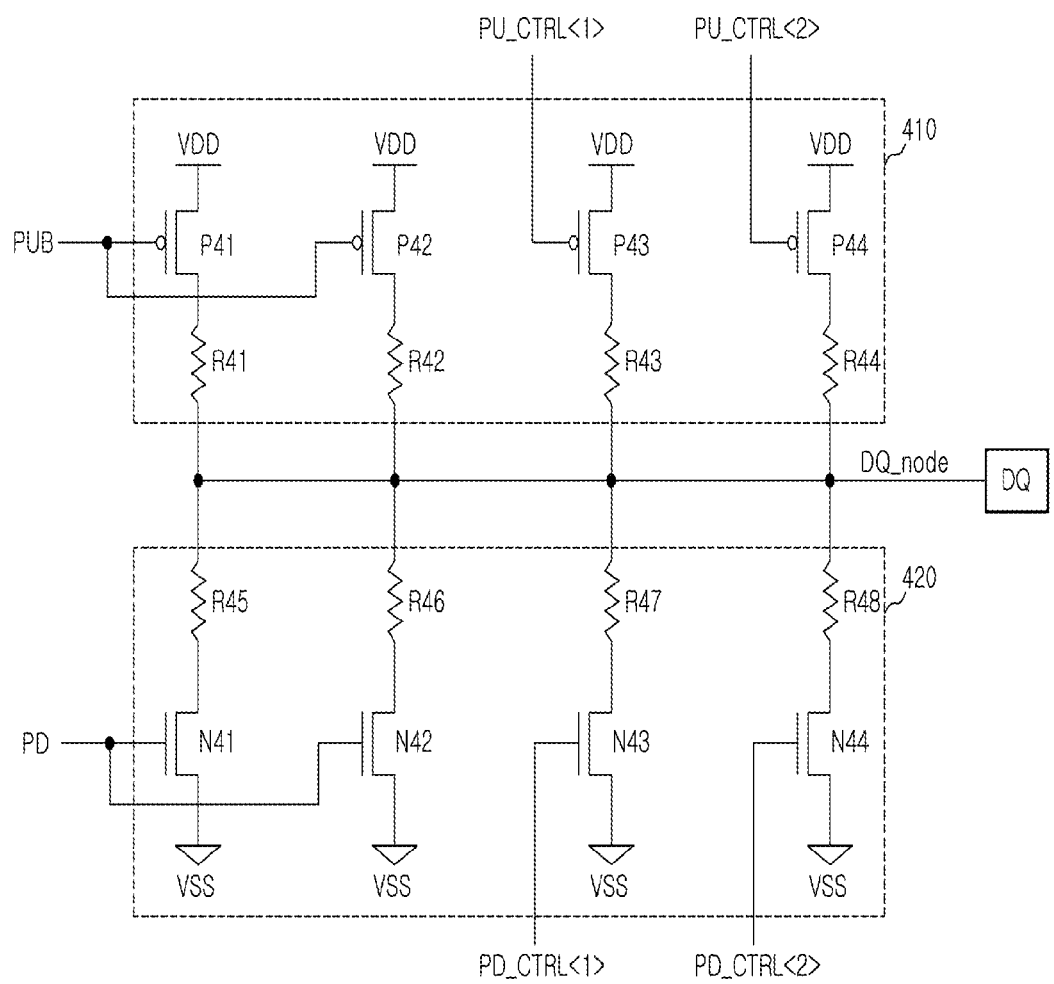
FIG. 5 is a diagram illustrating the detailed configuration of the drive capability controlling block that can be included in the circuit of FIG. 1.

FIG. 5 is a diagram illustrating the detailed configuration of the drive capability controlling block 400 that can be included in the circuit of FIG. 1. The drive capability controlling block 400, as shown in FIG. 5, can include a pull-up driver 410 and a pull-down driver 420.

The pull-up driver 410 can include third to sixth transistors P41 to P44 and eleventh to fourteenth resistor elements R41 to R44. The third transistor P41 can receive the pull-up signal 'PUB' through it's a gate and an external voltage VDD through it's a source. The fourth transistor P42 can receive the pull-up signal 'PUB' through its gate and the external voltage VDD through it's a source. The fifth transistor P43 can receive the first pull-up control signal 'PU_CTRL<1>'through it's a gate and the external voltage VDD through it's a source. The sixth transistor P44 can receive the second pull-up control signal 'PU_CTRL<2>' through it's a gate and the external voltage VDD through its source. One end of the eleventh resistor element R41 can be connected with a drain of the third transistor P41 and the other end can be connected with an output node DQ_node. One end of the twelfth resistor element R42 can be connected with a drain of the fourth transistor P42 and the other end can be connected with the output node DQ_node. An end of the thirteenth resistor element R43 can be connected with a drain of the fifth transistor P43 and the other end can be connected with the output node DQ_node. An end of the fourteenth resistor element R44 can be connected with a drain of the sixth transistor P44 and the other end can be connected with the output node DQ_node. Each of the third to sixth transistors P41 to P44 can drive and provide the external voltage VDD to the output node DQ_node when the third to six transistor P41 to P44 is activated as a driver. The fifth and sixth transistors P43 and P44 can be called control drivers because they can receive the first and second pull-up control signals 'PU_CTRL<1:2>' and are selectively turned on.

As a result, the pull-up capability of the pull-up driver 410 can depend on the number of transistors that are turned on in response to the pull-up signal 'PUB' and the first and second pull-up control signal 'PU_CTRL<1:2>', in the third to sixth transistors P41 to P44.

The pull-down driver 420 can include seventh to tenth transistors N41 to N44 and fifteenth to eighteenth resistor elements R45 to R48. Ends of the fifteenth to eighteenth resistor element R45 to R48 can be commonly connected with the output node DQ_node. The seventh transistor N41 can include a drain connected with the other end of the fifteenth resistor element R45, a gate which can receive the pull-down signal PD, and a source connected with the grounding terminal VSS. The eighth transistor N42 can include a drain connected with the other end of the sixteenth resistor element R46, a gate which can receive the pull-down signal 'PD', and a source connected with the grounding terminal VSS. The ninth transistor N43 can include a drain connected with the other end of the seventeenth resistor element R47, a gate which can receive the first pull-down control signal 'PD_CTRL<1>', and a source connected with the grounding terminal VSS. The tenth transistor N44 can include a drain connected with the other end of the eighteenth resistor element R48, a gate which can receive the second pull-down control signal 'PD_CTRL<2>', and a source connected with the grounding terminal VSS. Each of the seventh to tenth transistors N41 to N44 can drive and provide a voltage at the level of the grounding terminal VSS, as a driver, to the output node DQ_node. The ninth and tenth transistors N43, N44 can be called control transistors because they cab receive the first and second pull-down control signals 'PD_CTRL<1:2>' and can be selectively turned on.

As a result, the pull-down capability of the pull-down driver 420 can depend upon the number of transistors that are turned on in response to the pull-down signal PD and the first and second pull-down control signals 'PD_CTRL<1:2>', in the seventh to tenth transistors N41 to N44.

The output driver of a semiconductor memory apparatus, according to an embodiment described herein and having the above configuration, can operates in the following manner. Referring to FIG. 2, the voltage driving block 100 can generate the first to fourth divide voltages 'PU_VB<1:2>', 'PD_VB<1:2>', in which the level of the first divide voltage 'PU_VB<1>' can be higher than the voltage level of the second node N2, the level of the second divide voltage 'PU_VB<2>' can be lower than the voltage level of the second node N2, the level of the third divide voltage 'PD_VB<1>' can be higher than the voltage level of the sixth node N6, and the level of the fourth divide voltage 'PD_VB<2>' can be lower than the voltage level of the sixth node N6.

Referring to FIG. 3, the threshold voltage detecting block 200 can generate the pull-up detecting voltage 'PU_VT' and the pull-down detecting voltage 'PD_VT'. The pull-up detecting voltage 'PU_VT' is a voltage which can be obtained by dropping the internal voltage 'VINT' by as much as the threshold voltage of the first transistor P21 and the level can be expressed by 'VINT'-'Vth1' (herein, 'Vth1' is the threshold voltage of the first transistor P21). Further, the pull-down detecting voltage 'PD_VT' is the voltage of the drain and the source of the second transistor N21 and the level can be expressed as 'Vth2' (herein 'Vth2' is the threshold voltage of the second transistor N21).

The voltage level of the second node N2 shown in FIG. 2 can be set the same as the level of the pull-up detecting voltage 'PU_VT' and the voltage level of the sixth node N6 is set the same as the pull-down detecting voltage 'PD_VT'.

The pull-up control signal generating unit 310 shown in FIG. 4 can fix levels of the first and second pull-up control signals 'PU_CTRL<1:2>' to high levels, regardless of the pull-up signal 'PUB', when the pull-up detecting voltage 'PU_VT' is higher than the first divide voltage 'PU_VB<1>'. The pull-up control signal generating unit 310 can generate the first pull-up control signal 'PU_VB<1>' in response to the pull-up signal 'PUB' and can fix the second pull-up control signal 'PU_VB<2>' to a high level, regardless of the pull-up signal, when the pull-up detecting voltage 'PU_VT' is between the first divide voltage 'PU_VB<1>' and the second divide voltage 'PU_VB<2>'. Further, the pull-up control signal generating unit 310 can generate the first and second pull-up control signals 'PU_CTRL<1:2>' in response to the pull-up signal 'PUB', when the pull-up detecting voltage 'PU_VT' decreases more than the second divide voltage 'PU_VB<2>'.

The pull-down control generating unit 320 can fix the levels of the first and second pull-down control signals 'PD_CTRL<1:2>' to low levels, when the pull-down detecting voltage 'PD_VT' is lower than the fourth divide voltage 'PD_VB<2>'. The pull-down control generating unit 320 can generate the second pull-down control signal 'PD_CTRL<2>' in response to the pull-down signal 'PD' and can fix the first pull-down control signal 'PD_CTRL<1>' to a low level, regardless of the pull-down signal 'PD', when the pull-down detecting voltage 'PD_VT' is between the third divide voltage 'PD_VB<1>' and the fourth divide voltage 'PD_VB<2>'. Further, the pull-down control generating unit 320 can generate the first and second pull-down control signals 'PD_CTRL<1:2>' in response to the pull-down signal 'PD', when the pull-down detecting voltage 'PD_VT' is increased more than the third divide voltage 'PD_VB<3>'.

The third and fourth transistors P41, P42 of the third to sixth transistors P41 to P44 in the pull-up driver 410 shown in FIG. 5 can be activated in response to the pull-up signal 'PUB'. Further, the fifth transistor P43 can be activated in response to the first pull-up control signal 'PU_CTRL<1>' and the sixth transistor P44 can be activated in response to the second pull-up control signal 'PU_CTRL<2>'. That is, the pull-up capability of the pull-up driver 410 can be controlled by the number of activated transistors in the third to sixth transistors P41 to P44.

The seventh and eighth transistors N41, N42 of the seventh to tenth transistors N41 to N44 in the pull-down driver 420 can be activated in response to the pull-down signal 'PD'. The ninth transistor N43 can be activated in response to the first pull-down control signal 'PD_CTRL<1>' and the tenth transistor N44 can be activated in response to the second pull-down control signal 'PD_CTRL<2>'. The pull-down capability of the pull-down driver 420 can be controlled by the number of activated transistors in the seventh to tenth transistors N41 to N44.

The first transistor P21 of the pull-up threshold detecting unit 210 and the third to sixth transistors P41 to P44 of the pull-up driver 410 can be the same types of drivers and manufactured by the same process. Therefore, each threshold voltage of the third to sixth transistors P41 to P44 and the threshold voltage of the first transistor P21 can be at the same level. Further, the second transistor N21 of the pull-down threshold voltage detecting unit 220 and the seventh to tenth transistors N41 to N44 of the pull-down driver 420 can be the same types of drivers and manufactured by the same process. Accordingly, the levels of the threshold voltages of the seventh to tenth transistors N41 to N44 can be the same level as the threshold voltage of the second transistor N21. Therefore, changes in threshold voltage of the transistors P41 to P44, N41 to N44 of the pull-up driver 410 and the pull-down driver 420 can be detected by the first and second transistors P21, N21. Further, it is possible to control the pull-up or the pull-down capability of the pull-up driver 410 and the pull-down driver 420, using the detected results.

In the pull-up driver 410, according to one embodiment, when the pull-up detecting voltage 'PU_VT' is at a higher level than the first divide voltage 'PU_VB<1>', two transistors P41, P42 can be driven by the pull-up signal 'PUB'. In the pull-up driver 410, when the level of the pull-up detecting voltage 'PU_VT' is between the levels of the first divide voltage 'PU_VB<1>' and the second divide voltage 'PU_VB<2>', the three transistors P41, P42, P43 can be driven by the pull-up signal 'PUB'. In the pull-up driver 410, when the level of the pull-up detecting voltage 'PU_VT' is lower than the level of the second divide voltage 'PU_VB<2>', the four transistors P41 to P44 can be driven by the pull-up signal PUB.

That is, the pull-up driver 410 can maintain a predetermined pull-up capability by increasing the number of transistors that response to the pull-up signal, as the threshold voltage of the transistor increases. On the contrary, the pull-up driver 410 can maintain a predetermined pull-up capability by decreasing the number of transistors that respond to the pull-up signal, as the threshold voltages of the transistors decrease.

In the pull-down driver 420, according to this embodiment, when the pull-down detecting voltage 'PD_VT' is at lower level of the fourth divide voltage 'PD_VB<2>', two transistors N41, N42 can be driven by the pull-down signal 'PD'. In the pull-down driver 420, when the level of the pull-down detecting voltage 'PD_VT' is between the levels of the third divide voltage 'PD_VB<1>' and the fourth divide voltage 'PD_VB<2>', the three transistors N41, N42, N43 can be driven by the pull-down signal PD. In the pull-down driver 420, when the level of the pull-down detecting voltage 'PD_VT' is higher than the level of the third divide voltage 'PD_VB<1>', the four transistors N41 to N44 can be driven by the pull-down signal 'PD'.

That is, the pull-down driver 420 can maintain a predetermined pull-down capability by increasing the number of transistors that can respond to the pull-down signal, as the threshold voltage of the transistor increases. On the contrary, the pull-down driver 420 can maintain a predetermined pull-up capability by decreasing the number of transistors that can respond to the pull-down signal, as the threshold voltages of the transistors decrease.

As a result, the pull-up and the pull-down capabilities of the output drivers in the semiconductor memory apparatus can be maintained at predetermined levels, regardless of the threshold voltages of the transistors. Therefore, the semiconductor memory apparatus including the output drivers can achieve stable output.

While certain embodiments have been described above, it will be understood that the embodiments described are by way of example only. Accordingly, the descriptions herein should not be limited based on the described embodiments. Rather, the descriptions herein should only be limited in light of the claims that follow when taken in conjunction with the above description and accompanying drawings.

What is claimed is:

1. An output driver of a semiconductor memory apparatus, comprising:
    a voltage dividing block configured to generate divide voltages by dividing an internal voltage;
    a threshold voltage detecting block configured to generate a detecting voltage corresponding to changes in a threshold voltage of a transistor;
    a drive capability control signal generating block configured to generate a compare signal by comparing levels of the detecting voltage with the divide voltage and generate a control signal in response to an input signal when the compare signal is enabled; and
    a drive capability controlling block comprising:
        a driver configured to perform a driving operation in response to the input signal; and
        a control driver configured to perform a driving operation in response to the control signal.

2. The output driver of claim 1, wherein the threshold voltage detecting block is configured to drop a level of the detecting voltage when a level of the threshold voltage increases.

3. The output driver of claim 2, wherein the threshold voltage detecting block comprises:
    a transistor having a source receiving the internal voltage, a gate and a drain; and
    a resistor element configured to be connected to a node at an end connected with the gate and the drain of the transistor, and connected with a grounding terminal at the other end, and wherein the detecting voltage is configured to be output from the node connected with the transistor and the resistor element.

4. The output driver of claim 1, wherein the threshold voltage detecting block is configured to increase the level of the detecting voltage when the level of the threshold voltage increases.

5. The output driver of claim 4, wherein the threshold voltage detecting block comprises:
    a resistor element configured to receive the internal voltage through an end; and
    a transistor configured to be connected with the other end of the resistor element through a node connected with the drain and the gate, and of which the source is connected with a grounding terminal, and wherein the detecting voltage is configured to be output from the node connected with the resistor element and the transistor.

6. The output driver of claim 1, wherein the drive capability control signal generating block is configured to disable the control signal, regardless of the input signal, when the compare signal is disabled.

7. The output driver of claim 1, wherein the driver and the control driver include a second transistor, wherein the second transistor is the same type as the transistor.

8. An output driver of a semiconductor memory apparatus comprising:
    a voltage dividing block configured to generate a first divide voltage and a second divide voltage by dividing an internal voltage;
    a threshold voltage detecting block configured to generate a first detecting voltage inversely proportional to a level change of a threshold voltage of a first transistor and to generate a second detecting voltage proportional to a level change of a threshold voltage of a second transistor;
    a drive capability control signal generating block configured to generate a first control signal in response to a pull-up signal when a first compare signal generated by comparing levels of the first divide voltage and the first detecting voltage is enabled, and to generate a second control signal in response to a pull-down signal when a second compare signal generated by comparing levels of the second divide voltage and the second detecting voltage is enabled; and
    a drive capability controlling block coupled to the drive capability control signal generating block, the drive capability controlling block comprising:

a pull-up driver including:
  a first driver configured to perform a driving operation in response to the pull-up signal; and
  a first control driver configured to perform a driving operation in response to the first control signal; and
a pull-down driver comprising:
  a second driver configured to perform a driving operation in response to the pull-down signal; and
  a second control driver configured to perform a driving operation in response to the second control signal.

9. The output driver of claim 8, wherein the first divide voltage has a level that is higher than a level of the second divide voltage.

10. The output driver of claim 8, wherein the threshold voltage detecting block comprises:
  a pull-up threshold voltage detecting unit configured to drop a level of the first detecting voltage when the level of the threshold voltage of the first transistor increases; and
  a pull-down threshold voltage detecting unit configured to increase a level of the second detecting voltage when the level of the threshold voltage of the second transistor increases.

11. The output driver of claim 10, wherein the pull-up threshold voltage detecting unit comprises:
  the first transistor having a source configured to receive the internal voltage, a gate, and a drain; and
  a resistor element configured to be connected with a node at an end connected with the gate and the drain of the first transistor, and configured to be connected with a grounding terminal at the other end, and wherein the first detecting voltage is configured to be output from the node connected with the first transistor and the resistor element.

12. The output driver of claim 10, wherein the pull-down threshold voltage detecting unit comprises:
  a resistor element configured to receive the internal voltage through an end; and
  the second transistor that is connected with the other end of the resistor element through the node connected with the drain and the gate, and of which the source is connected with a grounding terminal, and wherein the second detecting voltage is configured to be output from the node connected with the resistor element and the second transistor.

13. The output driver of claim 8, wherein the drive capability control signal generating block comprises:
  a first comparing unit configured to enable the first compare signal when the first detecting voltage is at a lower level than the first divide voltage;
  a first signal combining unit configured to enable the first control signal when the first compare signal and the pull-up signal are both enabled;
  a second comparing unit configured to enable the second compare signal when the second detecting voltage is at a higher level than the second divide voltage; and
  a second signal combining unit configured to enable the second control signal when the second compare signal and the pull-down signal are both enabled.

14. The output driver of claim 8, wherein the first driver and the first control driver include the same type of transistor as the first transistor.

15. The output driver of claim 8, wherein the second driver and the second control driver include the same type of transistor as the second transistor.

\* \* \* \* \*